United States Patent
Kusano et al.

(10) Patent No.: US 7,301,361 B2
(45) Date of Patent: Nov. 27, 2007

(54) LOGIC CIRCUIT FOR BOARD POWER-SUPPLY EVALUATION AND BOARD POWER-SUPPLY EVALUATING METHOD

(75) Inventors: Yoshiyuki Kusano, Tokyo (JP); Mutsumi Shimazaki, Tokyo (JP); Mika Horikoshi, Tokyo (JP); Yasuhiro Yamanaka, Tokyo (JP); Hiroaki Sakai, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 108 days.

(21) Appl. No.: 11/357,104

(22) Filed: Feb. 21, 2006

(65) Prior Publication Data

US 2007/0080706 A1    Apr. 12, 2007

(30) Foreign Application Priority Data

Oct. 11, 2005    (JP) .............................. 2005-296198

(51) Int. Cl.
*G01R 31/36* (2006.01)
*G06F 17/50* (2006.01)

(52) U.S. Cl. ........................................ 324/771; 703/14
(58) Field of Classification Search ...................... None
See application file for complete search history.

(56) References Cited

U.S. PATENT DOCUMENTS 4,042,830 A * 8/1977 Kellenbenz et al. .......... 307/40
5,933,358 A * 8/1999 Koh et al. ..................... 703/14
6,975,978 B1 * 12/2005 Ishida et al. .................. 703/15

FOREIGN PATENT DOCUMENTS

| JP | 04-317365 | 11/1992 |
|----|-----------|---------|
| JP | 05-211236 | 8/1993 |
| JP | 05-265605 | 10/1993 |
| JP | 06-138155 | 5/1994 |
| JP | 09-312359 | 12/1997 |
| JP | 11-250113 | 9/1999 |
| JP | 2000-137060 | 5/2000 |
| JP | 2001-222561 | 8/2001 |
| JP | 2004-022724 | 1/2004 |

* cited by examiner

*Primary Examiner*—Ernest Karlsen
(74) *Attorney, Agent, or Firm*—Buchanan Ingersoll & Rooney PC

(57) ABSTRACT

A logic circuit for board power-supply evaluation to be incorporated into a logic device loaded on a product board includes a circuit that simulates an operation of the logic device so that utilization rate is variable at an arbitrary frequency by use of a predetermined circuit in all available logic elements of the logic device; a circuit that judges normality/abnormality of an operation of the operation simulation circuit; a utilization control circuit that varies and controls utilization rate of the logic device by controlling execution of an operation of the operation simulation circuit based on a judgement result of the operation judgement circuit and sets a utilization rate when the operation simulation circuit is instructed to stop the operation; and a utilization output circuit that outputs the judgement result of the operation judgement circuit and the utilization rate set by the utilization control circuit to the outside.

6 Claims, 6 Drawing Sheets

UTILIZATION OUTPUT

UTILIZATION OUTPUT

LOGIC CIRCUIT FOR BOARD POWER-SUPPLY EVALUATION AND BOARD POWER-SUPPLY EVALUATING METHOD

BACKGROUND OF THE INVENTION

1. Field of the Invention

The present invention relates to a logic circuit for board power-supply evaluation and a board power-supply evaluating method for evaluating power-supply system of a printed circuit board loaded with a rewritable semiconductor integrated circuit device (hereinafter, "logic device") such as a field programmable gate array (FPGA).

2. Description of the Related Art

Logic devices to be loaded on printed circuit boards (hereinafter, "product boards") used in electronic apparatuses such as communications apparatuses, information apparatuses, and control apparatuses includes sequential circuits and combinational circuits, wiring areas/wiring switches, and the like, and by connecting those in combination, various functions according to the respective apparatuses have been realized.

Meanwhile, recently, there has been considerable increase in the scale (multiple pins) and reduction in required voltage of logic devices. As a result, in the product boards loaded with those logic devices, there have been reported occurrence of malfunction, such as an operation reset of the logic device or an abnormal output signal, due to voltage drop or ripple, a high-frequency noise (hereinafter, "power-supply system noise"), or the like. Therefore, when designing a power-supply system of a product board, power consumption of a logic device to be loaded is either calculated or predicted, and based on that data, capacitance, arrangement, and the like of a power-supply circuit and a bypass capacitor element are designed.

As the method for calculating or predicting the power consumption of a logic device, conventionally, a method for calculation by emulating a logic circuit incorporated in a product board by use of a dedicated evaluation device, which includes an emulator, a power unit, and a measuring unit (for example, Patent Document 1), has been employed.

Patent Document 1: Japanese Published Unexamined Patent Application No. 2001-222561

However, despite designing of a product board by estimating the power consumption of the logic device by logic simulation after a detailed design of a logic circuit as in the above, is was not possible to prevent the occurrence of the malfunction mentioned above.

For identifying the cause of occurrence of the malfunction, although it is necessary to distinguish whether there is a problem in a power-supply design of a product board or in a board circuit design such as timing, this is not easy. Moreover, although there is a method for evaluating a logic device alone by use of an evaluation board, there is no method for evaluating a power-supply system in operation of a logic device that has been loaded on a product board, namely, a logic device programmed so as to realize a function of an electronic apparatus to be applied.

SUMMARY OF THE INVENTION

It is an object of the present invention to at least solve the problems in the conventional technology.

According to an aspect of the present invention, a logic circuit for board power-supply evaluation includes an operation simulation circuit that simulates an operation of a logic device so that a utilization rate is variable at an arbitrary frequency by use of a predetermined circuit in all available logic elements of the logic device that is a rewritable semiconductor integrated circuit device loaded on a printed circuit board of an electronic apparatus and used for incorporating a function of the electronic apparatus; an operation judgement circuit that judges normality/abnormality of operation of the operation simulation circuit; a utilization control circuit that controls the utilization rate of the logic device by controlling execution of an operation of the operation simulation circuit based on a judgement result of the operation judgement circuit and sets a utilization rate when the operation simulation circuit is instructed to stop the operation; and a utilization output circuit that outputs to outside the judgement result of the operation judgement circuit and the utilization rate set by the utilization control circuit.

According to another aspect of the present invention, a board power-supply evaluating method includes setting a logic scale of a logic device that is a rewritable semiconductor integrated circuit device used for incorporating a function of an electronic apparatus; generating an operation simulation circuit that simulates, according to the logic scale, an operation of the logic device so that a utilization rate is variable at an arbitrary frequency by use of a predetermined circuit in all available logic elements in the logic scale; an operation judgement circuit that judges normality/abnormality of an operation of the operation simulation circuit; a utilization control circuit that varies and controls utilization rate of the logic device by controlling execution of an operation by the operation simulation circuit based on a judgement result of the operation judgement circuit and sets a utilization rate when the operation simulation circuit is instructed to stop the operation; and a utilization output circuit that outputs the judgement result of the operation judgement circuit and the utilization rate set by the utilization control circuit to the outside; incorporating generated circuits into the logic device loaded on a printed circuit board of the electronic apparatus; and operating the logic circuit for board power-supply evaluation in the logic device where the same has been incorporated and evaluating a power-supply system of the printed circuit board based on an obtained existence of an abnormal operation and a utilization rate according thereto.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of a logic circuit for board power-supply evaluation and a board power-supply evaluating method according to the present invention will be explained in detail with reference to the accompanying drawings.

Figure 1:
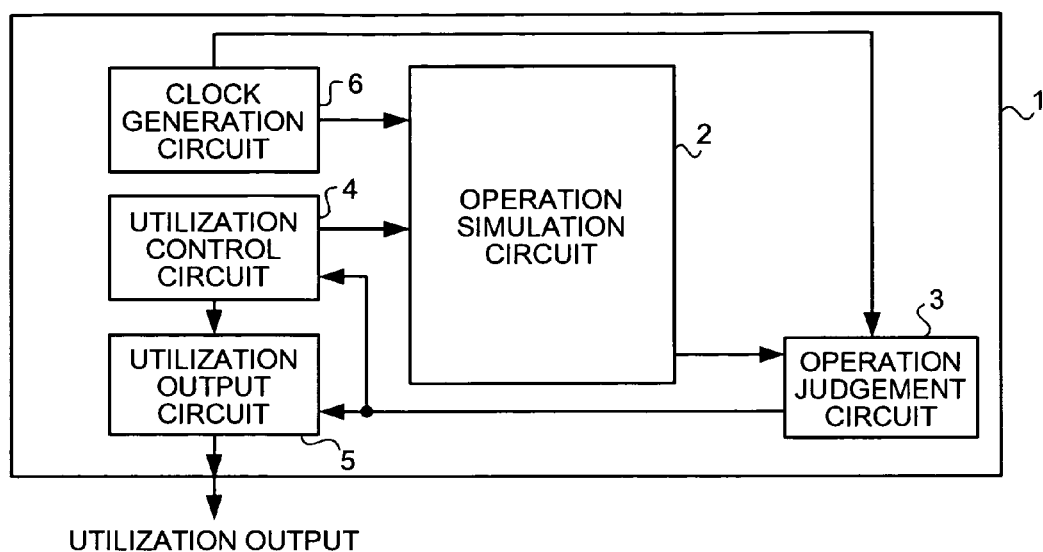
FIG. 1 is a block diagram of a logic circuit for board power-supply evaluation according to a first embodiment of the present invention.

FIG. 1 is a block diagram of a logic circuit 1 for board power-supply evaluation according to a first embodiment of the present invention. The logic circuit 1 can be incorporated into a logic device loaded on a product board. The logic circuit 1 includes an operation simulation circuit 2, an operation judgement circuit 3, a utilization control circuit 4, a utilization output circuit 5, and a clock generation circuit 6.

The clock generation circuit 6 supplies a clock signal to the operation simulation circuit 2. Moreover, the clock generation circuit 6 supplies a clock signal to the operation judgement circuit 3 or the like if necessary. The clock generation circuit 6 includes, for example, a PLL control circuit (phase-locked loop) provided for the logic device. The clock generation circuit 6 can supply a clock signal, which is obtained by changing an arbitrary frequency, to at least the operation simulation circuit 2.

Figure 2:
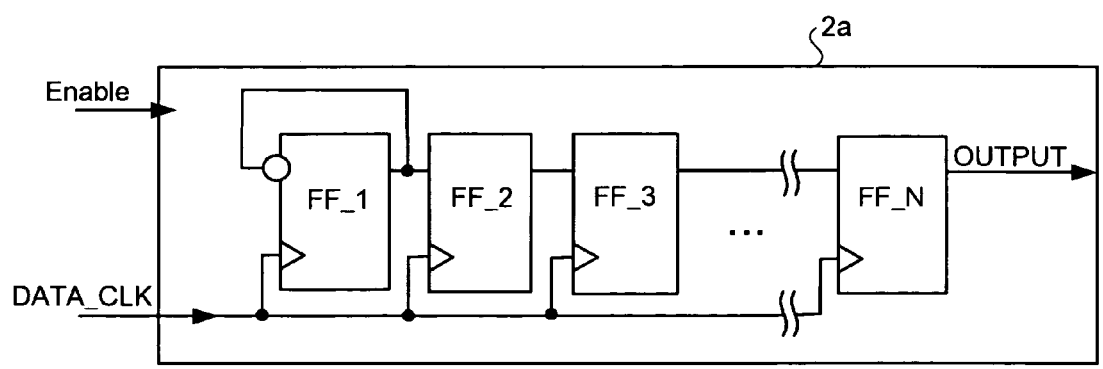
FIG. 2 is a detailed circuit diagram of a first configuration example (basic configuration example) of an operation simulation circuit shown in FIG. 1.
Figure 3:
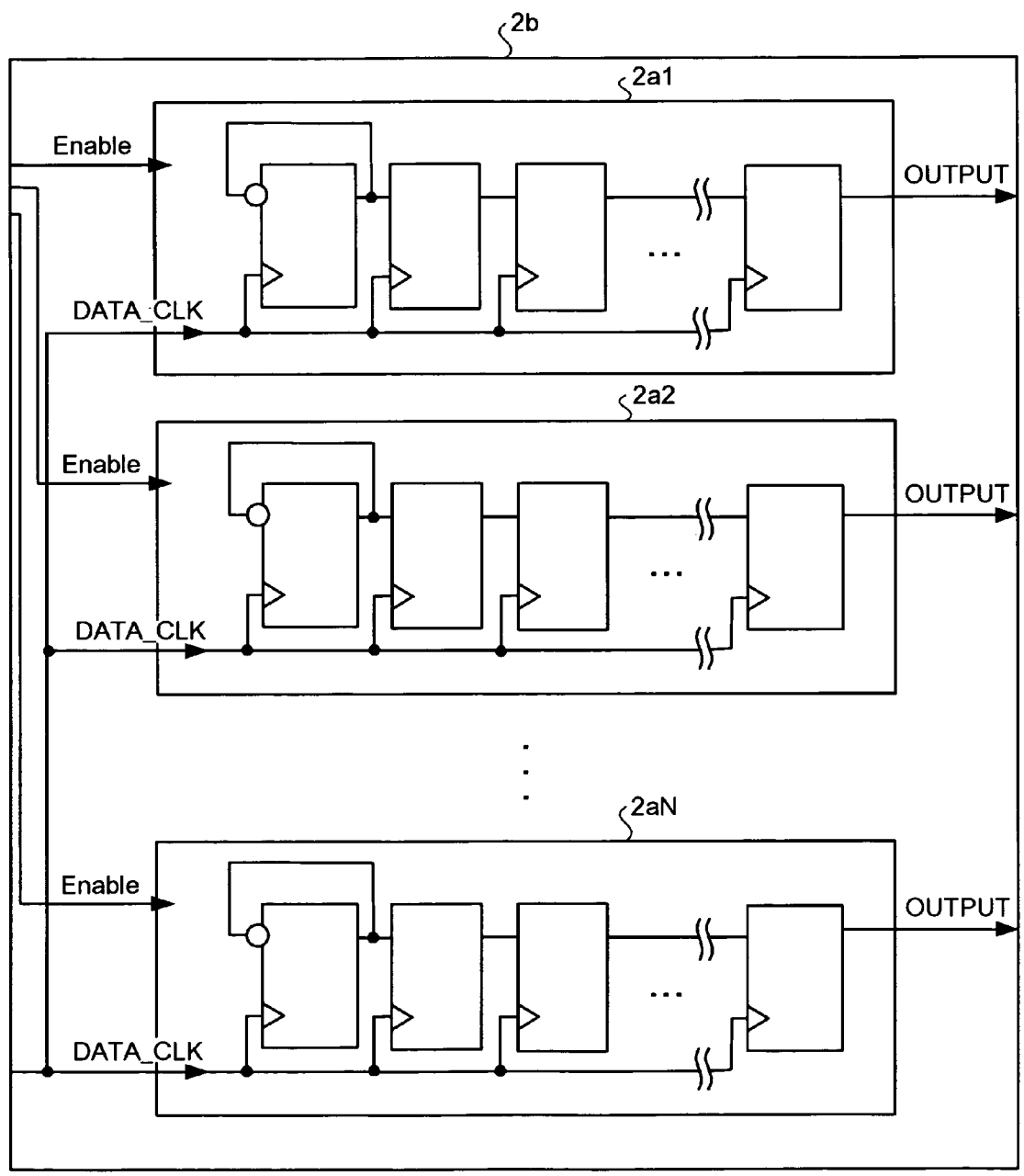
FIG. 3 is a detailed circuit diagram of a second configuration example (dividing/grouping configuration example) of the operation simulation circuit shown in FIG. 1.

The operation simulation circuit 2 can have a configuration as shown in FIG. 2 (first configuration example) and FIG. 3 (second configuration example) for sequential circuits (FFs: flip-flops) in all available logic elements of the logic device in the first embodiment. The operation simulation circuit 2 can carry out an operation simulation while varying utilization rate of the logic device by executing a simulation operation at an arbitrary frequency, which is carried out by giving a clock signal from the clock generation circuit 6 to the respective sequential circuits in a predetermined order, according to control signals for an operation permission and for an operation stop inputted from the utilization control circuit 4.

Figure 4:
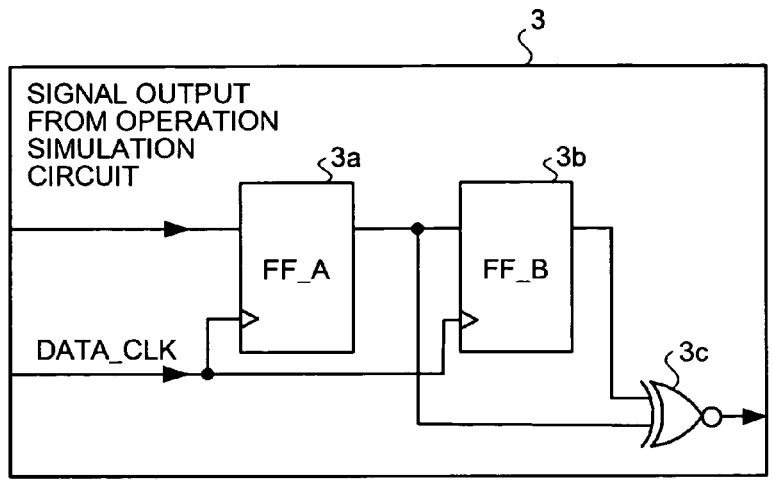
FIG. 4 is a detailed circuit diagram of a configuration example of an operation judgement circuit shown in FIG. 1.

The operation judgement circuit 3 is configured as shown in, for example, FIG. 4. The operation judgement circuit 3 judges normality/abnormality of the simulation operation based on an output result from the operation simulation circuit 2, and notifies the utilization control circuit 4 and utilization output circuit 5 of a result of the judgement.

Figure 5:
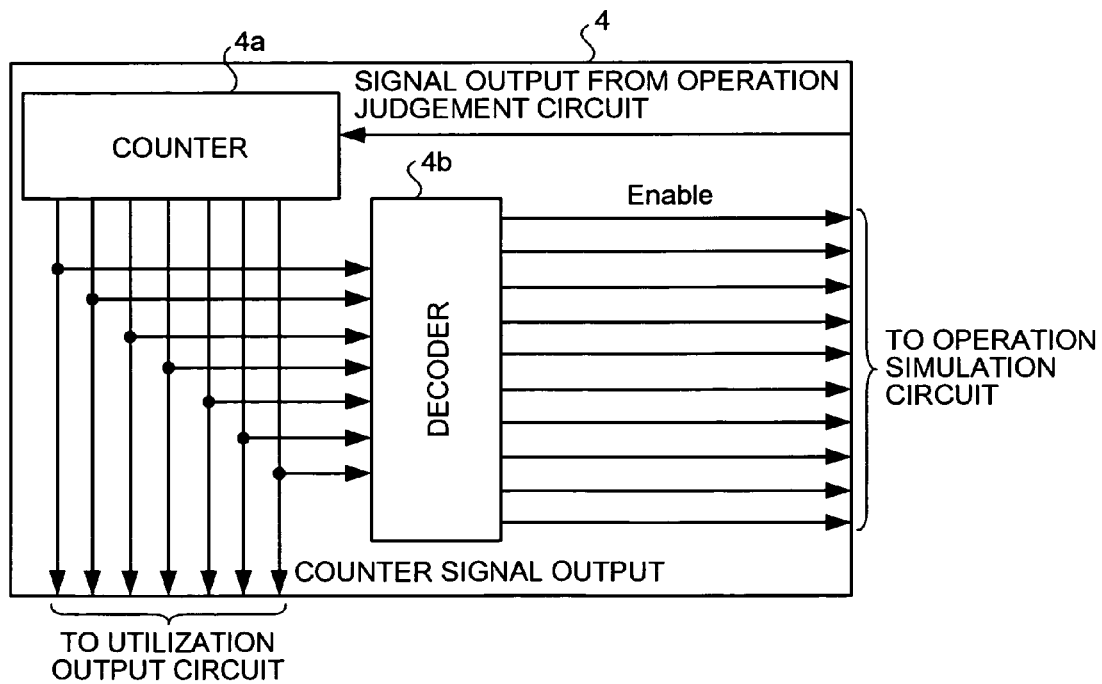
FIG. 5 is a detailed circuit diagram of a utilization control circuit shown in FIG. 1.

The utilization control circuit 4 is configured as shown in, for example, FIG. 5. The utilization control circuit 4 monitors the judgement result of the operation judgement circuit 3, and executes utilization rate control of the logic device by carrying out control to increase the utilization rate from 0 percent toward 100 percent by continuously giving a control signal for an operation permission to the operation simulation circuit 2 during a time of "operation normality," and giving, if the utilization rate reaches 100 percent without occurrence of an operation abnormality, a control signal for an operation stop to the operation simulation circuit 2 at that point in time so as to hold and output the utilization rate of 100 percent, while giving, if an "operation abnormality" occurs in midstream, a control signal for an operation stop to the operation simulation circuit 2 at that point in time so as to hold and output the utilization rate equal to or less than 100 percent at that time.

The utilization output circuit 5 monitors the judgement result of the operation judgement circuit 3, and outputs, if no operation abnormality occurs at all, the utilization rate of 100 percent retained and outputted by the utilization control circuit 4, and, if an operation abnormality occurs in midstream, the utilization rate equal to or less than 100 percent retained and outputted by the utilization control circuit 4 at that point in time, to the outside in an identifiable manner, respectively.

At this time, usually, in a logic device to be loaded on a product board, it is difficult to secure output pins dedicated for a logic circuit for board power-supply evaluation according to the present invention. Therefore, in the present embodiment, the utilization output circuit 5 outputs the utilization rate after converting the same to an output mode tailored to the number of pins that can be secured. For example, when the number of output pins that can be secured is one although the utilization control circuit 4 outputs the utilization rate in a parallel form, the utilization rate is made into one signal by a serial conversion.

FIG. 2 is a detailed circuit diagram of a first configuration example (basic configuration example) of the operation simulation circuit 2 as an operation simulation circuit 2a. The operation simulation circuit 2a includes N, where N is a positive integer, series connected sequential circuits FF_1 to FF_N, which are all the available logic elements of the logic device. An output bit of first sequential circuit FF_1 is input, in an inverted manner, to a data input terminal of the first sequential circuit FF. Moreover, clock input terminals of the sequential circuits FF_1 to FF_N are connected to a clock line. If a control signal Enable from the utilization control circuit 4 indicates an operation permission, the operation simulation circuit 2a can supply a clock signal DATA_CLK from the clock generation circuit 6 to the clock line.

When the control signal Enable from the utilization control circuit 4 indicates an operation permission, because the N sequential circuits FF_1 to FF_N alternately transmit bit 1 and bit 0 in turn according to the clock signal DATA_CLK, this operates in synchronization with a period (frequency: F/2) twice as long as that of the clock signal DATA_CLK (frequency: F). When an operation abnormality occurs in any sequential circuit, the bit 1 or bit 0 is consecutively outputted. Thereby, in the operation simulation circuit 2a, an operation of the logic device can be simulated.

As shown in FIG. 2, for making it possible to change the utilization rate in a configuration where all sequential circuits in all available logic elements of the logic device are connected in series, it is basically sufficient to supply the clock signal DATA_CLK to each of all sequential circuits individually. A further practical configuration example where the utilization rate can be changed is shown in FIG. 3.

FIG. 3 is a detailed circuit diagram of a second configuration example (dividing/grouping configuration example) of the operation simulation circuit 2 as an operation simulation circuit 2b. In the operation simulation circuit 2b, sequential circuits in all the available logic elements of the logic device are divided into a plurality of groups 2a1 to 2aN, where N is a positive integer. The sequential circuits in each group are connected in the same manner as in the operation simulation circuit 2a. The clock signal DATA_CLK from the clock generation circuit 6 is input into the clock line of each group. Moreover, operation control is carried out according to control signals for an operation permission and for an operation stop inputted from the utilization control circuit 4. With such a configuration, a simulation operation while varying utilization rate of the logic device can be effectively executed.

FIG. 4 is a detailed circuit diagram of a configuration example of the operation judgement circuit 3. The operation judgement circuit 3 includes a sequence circuit (FF_A) 3a and a sequence circuit (FF_B) 3b, which are connected in series, and an exclusive OR circuit 3c. A clock signal DATA_CLK from the clock generation circuit 6 is supplied to the clock input terminals of the sequential circuit (FF_A) 3a and the sequence circuit (FF_B) 3b. A signal output from the operation simulation circuit 2 is input into a data input terminal of the sequential circuit (FF_A) 3a. A data bit output from the sequential circuit (FF_A) 3a is input into both the sequential circuit (FF_B) 3b and the exclusive OR circuit 3c. A data bit output from the sequential circuit (FF_B) 3b is also input into the exclusive OR circuit 3c.

When the operation simulation circuit 2 is normally operating, because one of the two inputs into the exclusive OR circuit 3c is bit 1 and the other is 0, the exclusive OR circuit 3c consecutively outputs bit 0. On the other hand, if the operation simulation circuit 2 performs an abnormal operation, because the two inputs into the exclusive OR circuit 3c both result in bit 1 or bit 0, the exclusive OR circuit 3c consecutively outputs bit 1 at a point in time where the abnormal operation has occurred. Thereby, in the operation judgement circuit 3, whether the operation simulation circuit 2 is normally operating or an abnormal operation has occurred can be judged.

The operation judgement circuit 3 shown in FIG. 4 can be used in combination with the operation simulation circuit 2a shown in FIG. 2. An operation judgement circuit that can be used in combination with the operation simulation circuit 2b shown in FIG. 3 can be configured in a similar manner. In other words, because the N groups 2a1 to 2aN operate in order, an operation judgement circuit that can be used in combination with the operation simulation circuit 2b can be obtained by adding an OR circuit into which respective outputs from the groups 2a1 to 2aN are inputted.

FIG. 5 is a detailed circuit diagram of the utilization control circuit 4. The utilization control circuit 4 includes a counter 4a that gives utilization rate of the operation simulation circuit 2 and a decoder 4b that outputs the control signal Enable. Here, a case where the operation simulation circuit 2 is the operation simulation circuit 2b shown in FIG. 3 will be explained.

The counter 4a performs a count-up operation that increases utilization rate of the operation simulation circuit 2b from 0 percent toward 100 percent in order during a time where an output from the operation judgement circuit 3 is a bit "0" level. As a result, when the utilization rate of the operation simulation circuit 2b becomes 100 percent, the counter 4a stops the count-up operation at that point in time, and holds and outputs the count value. In addition, when an output from the operation judgement circuit 3 becomes a bit "1" level in the course of the count-up operation, the counter 4a stops the count-up operation at that point in time, and holds and outputs the count value.

The decoder 4b generates and outputs control signals Enable that indicate an operation permission and an operation stop to corresponding groups of the groups 2a1 to 2aN based on a count value that the counter 4a outputs in the process of the count-up operation mentioned above and a count value retained and outputted. Thereby, in the operation simulation circuit 2b, because "execution of an operation" and a "stop thereof" of the groups 2a1 to 2aN are individually controlled in order, this allows carrying out a simulation operation while varying the utilization rate. The utilization output circuit 5 has already been mentioned.

A method for carrying out a power-supply system evaluation (anti-power-supply noise evaluation) of a product board by use of the logic circuit 1 will be explained with reference to FIG. 6. A case when the operation simulation circuit 2 is the operation simulation circuit 2b shown in FIG. 3 is explained in FIG. 6.

Figure 6:
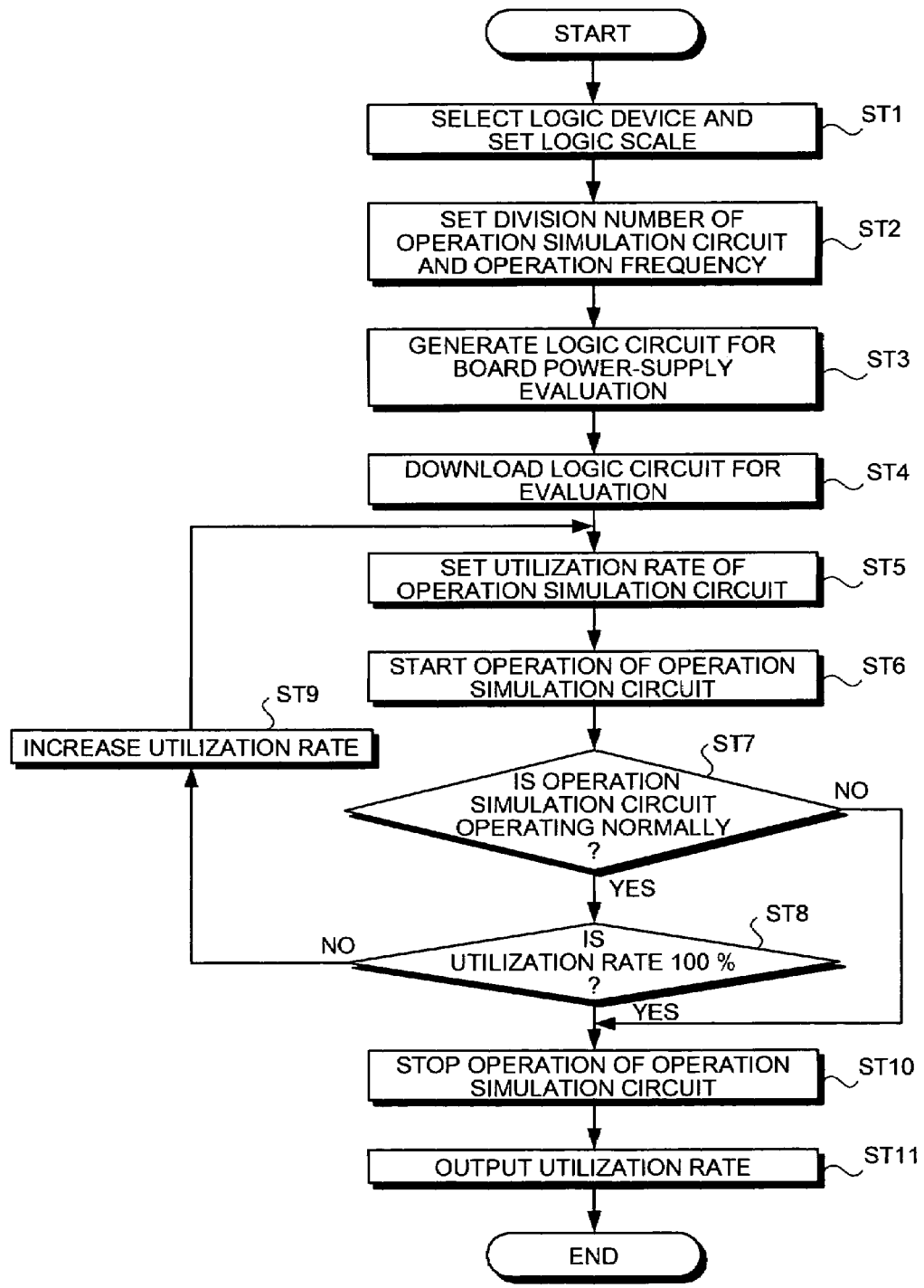
FIG. 6 is a flowchart for explaining processing procedure for evaluating the power-supply system of a product board by use of the logic circuit shown in FIG. 1.

As shown in FIG. 6, first, a logic device (hereinafter, "target device") to be loaded on a product board that is subject to an evaluation is selected, and a logic scale, which is the total number of logic elements in the selected target device, is set (step ST1). It is assumed here that the logic scale is 10000.

Then, the operation simulation circuit 2b is fabricated according to the logic scale so as to set a division number, and an operation frequency is set (step ST2). Out of the target devices 10000 assuming the the number of logic elements used for a control circuit and the like other than the operation simulation circuit 2b is 1000, and a number of logic elements that can be used as the operation simulation circuit 2b is 9000, the division number is set to 10. Each group of the operation simulation circuit 2b in this case results in a number of component elements of 900. Namely, the available logic elements are all provided as sequential circuits.

Next, the logic circuit 1 shown in FIG. 1 is generated based on the logic scale and the division number (step ST3). Subsequently, the generated logic circuit 1 is downloaded to the target device on the product board, namely, the generated logic circuit 1 is incorporated into the target device (step ST4).

In the incorporated logic circuit 1, a utilization rate is set by a reset processing (step ST5), and operation of the operation simulation circuit 2b is started based on the set utilization rate (step ST6). In the current example, first, provided is a setting to operate 900 logic elements, which are 10 percent of the total divided into 10 and grouped, and one group (for example, the first group 2a1) starts operation. In this case, a control signal Enable for an operation permission is given to the first group 2a1, and to all of the other groups, a control signal Enable for an operation stop is given.

After a standby for a delay time in response to the number of divided and grouped logic elements 900 in the operation simulation circuit 2b, in the operation judgement circuit 3, an output signal form the operation simulation circuit 2b is detected so as to judge as to whether the operation is normal or abnormal (step ST7).

When it is judged that the operation of the operation simulation circuit 2b is abnormal (step ST7: No), a control signal Enable for an operation stop is given to a group that has performed the abnormal operation of the operation simulation circuit 2b from the utilization control circuit 4, whereby all groups in the operation simulation circuit 2b are brought into a condition where the operation has stopped (step ST10). Because the utilization control circuit 4 holds the current utilization rate (utilization rate at a point in time where the abnormality has occurred), the utilization output circuit 5 outputs the utilization rate equal to or less than 100 percent at the point in time where the abnormality has occurred to the outside (step ST11).

When it is judged that the operation of the operation simulation circuit 2b is normal (step ST7: Yes), the current set utilization rate (current count value) is examined in the utilization control circuit (step ST8). If the utilization rate is less than 100 percent (step ST8: No), the utilization rate matched with the set division number is increased (step ST9), and returning to step ST5, the increased utilization rate is set as the utilization rate of the operation simulation circuit 2b. Namely, one group to be operated next is determined, a control signal Enable is given thereto, and to all the other groups, a control signal Enable for an operation stop is given.

If the utilization rate is equal to 100 percent in step ST8 (step ST8: Yes), a control signal Enable for an operation stop is given to the last Nth group 2aN by the utilization control circuit 4, whereby all groups in the operation simulation circuit 2b are brought in a condition where the operation has stopped (step ST10). Because the utilization control circuit 4 holds the current utilization rate (i.e., the utilization rate at a point in time where the normal operation has ended), the utilization output circuit 5 outputs the utilization rate equal to 100 percent at the point in time where the operation has normally ended to the outside (step ST11).

Thus, according to the first embodiment, while focusing on a point that a power-supply noise has no relationship with a function of a target electronic apparatus to be incorporated into a logic device and is dependent only on the number of logic elements to be used and the operation frequency of an internal logic, a logic circuit for board power-supply evaluation that can grasp the existence of an abnormal operation and utilization rate according thereto by simulating an operation while arbitrarily changing the utilization rate of the internal logic elements and the operation frequency is incorporated into a logic device to be loaded on a product board used for the target electronic apparatus, therefore, a power-supply system evaluation of the product board loaded with the logic device can be carried out by use of the existence of an abnormal operation and utilization rate according thereto outputted by the incorporated logic circuit for board power-supply evaluation.

Concretely, a logic circuit (hereinafter, "product-version logic circuit") used for a product board loaded with a logic device in which the logic device for board power-supply evaluation has been incorporated is operated, and when a problem such as an abnormal output signal occurs, a position where the problem resides can be swiftly distinguished such that, if an abnormal operation occurs in the logic circuit for board power-supply evaluation for which an operation frequency has been set based on specifications of the product-version logic circuit, the problem resides in the power-supply design of the product board, and if no abnormal operation occurs, the problem resides in the logic circuit design.

In addition, before a detailed design of a product-version logic circuit used for a product board or before incorporating a product-version logic circuit for which a detailed design has been completed into a product board, by loading a logic device in which the logic board for power-supply evaluation has been incorporated on the product board and operating the logic board for power-supply evaluation so as to carry out an anti-power-supply noise evaluation, it becomes possible to take countermeasures against a power-supply noise in advance.

Second Embodiment

Figure 7:
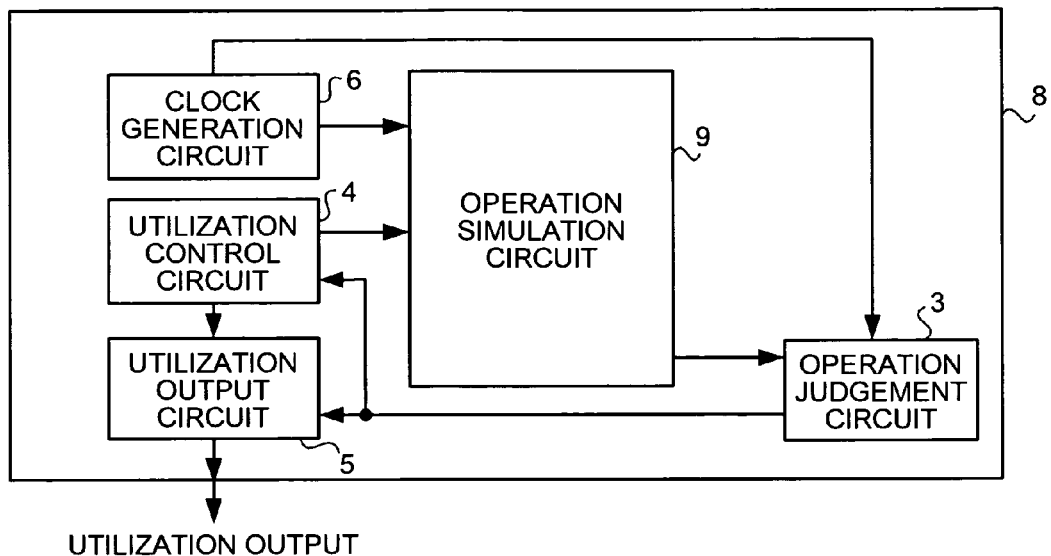
FIG. 7 is a block diagram of a logic circuit for board power-supply evaluation according to a second embodiment of the present invention.

FIG. 7 is a block diagram of a logic circuit for board power-supply evaluation according to a second embodiment of the present invention. In FIG. 7 identical symbols are used for components identical or equivalent to those shown in FIG. 1 (first embodiment). Only the new sections will be explained here.

A logic circuit 8 according to the second embodiment includes an operation simulation circuit 9. The operation simulation circuit 9 can be configured as shown in, for example, FIG. 8 (first configuration example) or FIG. 9 (second configuration example) for combinational circuits (INV: inverter circuits) in all available logic elements of the logic device, and can carry out an operation simulation while varying utilization rate of the logic device by executing a simulation operation, which is carried out by giving a clock signal from the clock generation circuit 6 to the respective combinational circuits in a predetermined order, according to control signals for an operation permission and for an operation stop inputted from the utilization control circuit 4.

Figure 8:
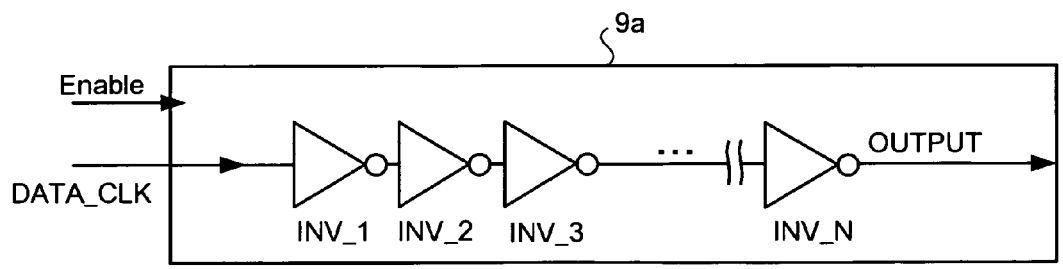
FIG. 8 is a detailed circuit diagram of a first configuration example (basic configuration example) of an operation simulation circuit shown in FIG. 7.

FIG. 8 is a detailed circuit diagram of a first configuration example (basic configuration example) of the operation simulation circuit 9 as an operation simulation circuit 9a. The operation simulation circuit 9a is configured so that, when there are N combinational circuits in all available logic elements of the logic device, the N combinational circuits INV_1 to INV_N are connected in series, and to an input end of the first combinational circuit INV_1, a clock signal DATA_CLK from the clock generation circuit 6 can be supplied when a control signal Enable from the utilization control circuit 4 indicates an operation permission.

When a control signal Enable received from the utilization control circuit 4 indicates an operation permission, because the N combinational circuits INV_1 to INV_N alternately transmit bit 1 and bit 0 of an inversion thereof according to the clock signal DATA_CLK, this operates in synchronization with a period (frequency: F/2) twice as long as that of the clock signal DATA_CLK (frequency: F). When an operation abnormality occurs in any combinational circuit, the bit 1 or the bit 0 is consecutively outputted. Thereby, in the operation simulation circuit 2a, an operation of the logic device can be simulated.

As shown in FIG. 8, for making it possible to change the utilization rate in a configuration where all combinational circuits in all available logic elements of the logic device are connected in series, it is basically sufficient to supply the clock signal DATA_CLK to each of all combinational circuits individually. A further practical configuration example where the utilization rate can be changed is shown in FIG. 9.

Figure 9:
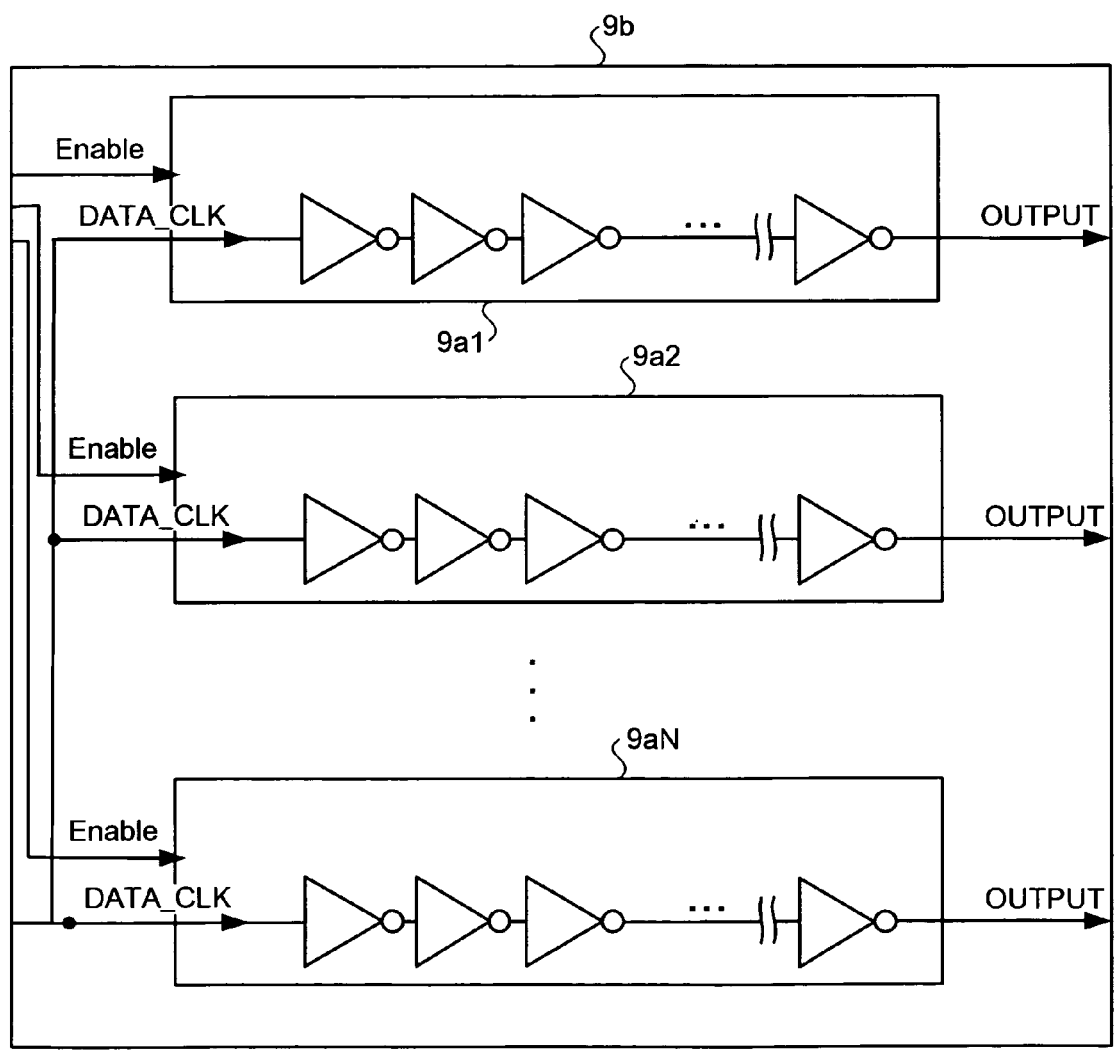
FIG. 9 is a detailed circuit diagram of a second configuration example (dividing/grouping configuration example) of the operation simulation circuit shown in FIG. 7.

FIG. 9 is a detailed circuit diagram of a second configuration example (dividing/grouping configuration example) of the operation simulation circuit 9 as an operation simulation circuit 9b. The operation simulation circuit 9b has a configuration where combinational circuits in all available logic elements of the logic device are divided into a plurality of groups (N in the illustrated example) so as to make up a plurality of circuits that can be connected in series as in the operation simulation circuit 9a into one group, a clock signal DATA_CLK from the clock generation circuit 6 is given for each of the groups 9a1 to 9aN having a connection relationship as in the operation simulation circuit 9a, and operation control is carried out according to control signals for an operation permission and for an operation stop inputted from the utilization control circuit 4. According to the configuration, a simulation operation while varying utilization rate of the logic device can be effectively executed.

In the second embodiment as well, a power-supply system evaluation (anti-power-supply noise evaluation) of a product board can be carried out according to the procedures shown in FIG. 6. Although, in terms of all available logic elements of the logic device that carries out an operation simulation, the sequential circuits have been cited and explained in the first embodiment and the combinational circuits have been cited and explained in the second embodiment, an operation simulation circuit for both the sequential circuits and combinational circuits can also be configured based on the same conception.

According to the present invention, it becomes possible to evaluate an anti-power-supply noise and distinguish a position where a problem resides when a malfunction occurs.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A logic circuit for board power-supply evaluation comprising:
    an operation simulation circuit that simulates an operation of a logic device so that a utilization rate is variable at an arbitrary frequency by use of a predetermined circuit in all available logic elements of the logic device that is a rewritable semiconductor integrated circuit device loaded on a printed circuit board of an electronic apparatus and used for incorporating a function of the electronic apparatus;
    an operation judgement circuit that judges normality/abnormality of operation of the operation simulation circuit;
    a utilization control circuit that controls the utilization rate of the logic device by controlling execution of an operation of the operation simulation circuit based on a judgement result of the operation judgement circuit and sets a utilization rate when the operation simulation circuit is instructed to stop the operation; and
    a utilization output circuit that outputs to outside the judgement result of the operation judgement circuit and the utilization rate set by the utilization control circuit.

2. The logic circuit according to claim 1, wherein
    the predetermined circuit is any one of a sequential circuit, a combinational circuit, and a circuit provided by uniting a sequential circuit and a combinational circuit, and
    the operation simulation circuit is configured so that all of the predetermined circuits execute and stop the operation in a predetermined order.

3. The logic circuit according to claim 1, wherein
    the predetermined circuit is any one of a sequential circuit, a combinational circuit, and a circuit provided by uniting a sequential circuit and a combinational circuit, and
    the operation simulation circuit is configured so that all of the predetermined circuits are divided into a plurality of groups by connecting a plurality of the predetermined circuits in series so as to make the same into one group and each of the divided group executes and stops the operation in a predetermined order.

4. A board power-supply evaluating method comprising:
    setting a logic scale of a logic device that is a rewritable semiconductor integrated circuit device used for incorporating a function of an electronic apparatus;
    generating
        an operation simulation circuit that simulates, according to the logic scale, an operation of the logic device so that a utilization rate is variable at an arbitrary frequency by use of a predetermined circuit in all available logic elements in the logic scale;
        an operation judgement circuit that judges normality/abnormality of an operation of the operation simulation circuit;
        a utilization control circuit that varies and controls utilization rate of the logic device by controlling execution of an operation by the operation simulation circuit based on a judgement result of the operation judgement circuit and sets a utilization rate when the operation simulation circuit is instructed to stop the operation; and
        a utilization output circuit that outputs the judgement result of the operation judgement circuit and the utilization rate set by the utilization control circuit to the outside;
    incorporating generated circuits into the logic device loaded on a printed circuit board of the electronic apparatus; and
    operating the logic circuit for board power-supply evaluation in the logic device where the same has been incorporated and evaluating a power-supply system of the printed circuit board based on an obtained existence of an abnormal operation and a utilization rate according thereto.

5. The board power-supply evaluating method according to claim 4, wherein
    the predetermined circuit is any one of a sequential circuit, a combinational circuit, and a circuit provided by uniting a sequential circuit and a combinational circuit, and
    the operation simulation circuit is configured so that all of the predetermined circuits execute and stop the operation in a predetermined order.

6. The board power-supply evaluating method according to claim 4, wherein
    the predetermined circuit is any one of a sequential circuit, a combinational circuit, and a circuit provided by uniting a sequential circuit and a combinational circuit, and
    the operation simulation circuit is configured so that all of the predetermined circuits are divided into a plurality of groups by connecting a plurality of the predetermined circuits in series so as to make the same into one group and each of the divided group executes and stops the operation in a predetermined order.

* * * * *